(12) United States Patent
Arai et al.

(10) Patent No.: US 6,811,627 B2
(45) Date of Patent: Nov. 2, 2004

(54) CHIP MOUNTING DEVICE AND CALLIBRATION METHOD THEREIN

(75) Inventors: Yoshiyuki Arai, Shiga (JP); Akira Yamauchi, Shiga (JP)

(73) Assignee: Toray Engineering Co., Ltd., Osaka (JP)

(*) Notice: Subject to any disclaimer, the term of this patent is extended or adjusted under 35 U.S.C. 154(b) by 0 days.

(21) Appl. No.: 10/363,693
(22) PCT Filed: Sep. 6, 2001
(86) PCT No.: PCT/JP01/07742
§ 371 (c)(1),
(2), (4) Date: Mar. 12, 2003
(87) PCT Pub. No.: WO02/25720
PCT Pub. Date: Mar. 28, 2002

(65) Prior Publication Data
US 2004/0026006 A1 Feb. 12, 2004

(30) Foreign Application Priority Data
Sep. 14, 2000 (JP) ........................ 2000-279454

(51) Int. Cl.[7] .............................................. B32B 31/00
(52) U.S. Cl. ........................ 156/64; 156/351; 156/362; 156/378
(58) Field of Search .................. 156/64, 351, 378, 156/362, 358; 702/95; 29/740, 741, 742, 743, 833, 734, 835, 836, 837, 838, 839, 840, 841

(56) References Cited

U.S. PATENT DOCUMENTS 5,225,026 A 7/1993 Ozawa et al.

FOREIGN PATENT DOCUMENTS

| JP | 11-87432 A | 3/1999 |
|---|---|---|
| JP | 2000-269241 A | 9/2000 |
| JP | 2000-269242 A | 9/2000 |
| JP | 2001-102397 A | 4/2001 |

OTHER PUBLICATIONS

English Language Translation of JP 2000–269241 (Reference submitted in IDS).*
English Language Translation of JP 2000–269242 (Reference submitted in IDS).*
English Language Translation of JP 2001–102397 (Reference submitted in IDS).*

* cited by examiner

Primary Examiner—Melvin C. Mayes
Assistant Examiner—George R. Koch, III
(74) Attorney, Agent, or Firm—Smith Patent Office

(57) ABSTRACT

A chip mounting device comprising a first recognition means (3) for recognizing a first recognition mark (5) on the upper chip-retainable head (2) side, a second recognition means (4) for recognizing a second recognition mark (6) on the lower substrate-retainable stage (1) side, a third recognition means (18) for recognizing the recognition marks (5, 6) concurrently when the first recognition mark (5) is brought close to or into contact with the second recognition mark (6), and a temperature detection means (17) attached to the first recognition means (3) or the second recognition means (4), wherein calibration is carried out based on the recognition of the recognition marks when the temperature detection means (17) detects a beyond-allowance temperature change, whereby permitting a high-accuracy, efficient calibration independently of mechanical deformation and temperature change in environmental atmosphere.

15 Claims, 9 Drawing Sheets

CHIP MOUNTING DEVICE AND CALLIBRATION METHOD THEREIN

This application is the national phase under 35 U.S.C. 371 of PCT Internation Application No. PCT/JP01/07742, which has an International filing date of Sep. 6, 2001, which designated the United States of America and which claims priority on Japanese Patent Application number 2000-279454, filed Sep. 14, 2000.

TECHNICAL FIELD OF THE INVENTION

The present invention relates to a chip mounting device and a calibration method therein.

BACKGROUND ART OF THE INVENTION

As is well known, in a chip mounting, relative to a chip retained by an upper head, a mounting part of a substrate (for example, a liquid crystal panel) retained by a lower substrate-retaining stage is precisely positioned, and at that state, the chip is mounted on the substrate by moving the head down. Therefore, prior to the mounting, for example, the positions of recognition marks for mounting (alignment marks) provided on the chip and the substrate are recognized by an appropriate recognition means such as a two-sight recognition means, and the relative position between the chip and the substrate is adjusted by controlling the position of the substrate-retaining stage so that a positional shift between both recognition marks disappear. At that time, the above-described recognition means is proceeded from its retraction position to its recognition position or retracted in the contrary direction.

However, in a period for carrying out mounting operations successively after such steps, since a dimensional variation may occur in respective parts of the device originating from a change of an environmental condition such as a rise of a temperature in an operation room, if the control for movement of the recognition means is carried out at an identical condition for a long period of time, an error may be generated in the positional recognition of the recognition marks for mounting. If an error is generated, a high-accuracy mounting may become difficult. Accordingly, in order to maintain a mounting accuracy of a $\mu$m level, a calibration of the movement control system for the recognition means is carried out at an appropriate timing, as needed. With respect to such a calibration, various methods have been proposed.

For example, in a method disclosed in paragraphs [0036] to [0042], a mark table is attached to a Z table provided with a head (corresponding to a bonding tool) through a vertical movement device, and the mark table is moved to a position with the same level as that of a chip (corresponding to a semiconductor chip), which is retained by a head by vacuum suction, by driving the vertical movement device. Then, a recognition means (corresponding to a camera for a chip and a camera for a substrate) is moved below the mark table, and the recognition mark provided on the mark table (corresponding to a reference mark for calibration) is recognized. After the recognition means is retracted therefrom, the mark table is moved to a position with the same level as that of a substrate (corresponding to a circuit substrate) retained by the substrate-retaining stage (corresponding to a bonding stage) by driving the vertical movement device. The recognition means is moved to a position above the mark table, and the above-described recognition mark is recognized. Then, based on the control parameters obtained by both recognitions, the previous control parameters, which have been stored in the movement control system of the recognition means, are renewed for the following calibration.

In such a calibration method, however, at a position far away from the position for recognizing the recognition marks for mounting (alignment marks) provided on the chip and the substrate, respectively, a recognition mark for calibration different from the recognition marks for mounting is recognized. Therefore, the load (bending moment) acting on a movable table, which moves the recognition means, varies between when the recognition means is moved to a position for recognizing one mark among these marks (for example, the above-described recognition mark for calibration) and when the recognition means is moved to another position for recognizing the other mark (for example, the above-described recognition mark for mounting). Since the difference in deflection due to this variation may become an error in positional recognition of the recognition marks, a further high-accuracy calibration is obstructed.

Moreover, since the calibration is carried out at an appropriate timing based on experiences, the timing for the calibration is not always optimum, and therefore, the times of calibration may become many and unnecessary time may be accumulated.

Further, when a two-sight recognition means is employed, because its upper optical axis and lower optical axis are likely to be shifted, it is necessary to correct the shift, and because the correction parameters required for the correction can be determined experientially from the result of the measurement of the accuracy of the two-sight recognition means and the like but they are likely to be influenced by a change of season (a temperature change in environmental atmosphere) and the like, it is difficult to maintain the calibration accuracy constant. If the calibration accuracy is tried to be maintained constant, the time for the calibration may become long and the efficiency may reduce. Further, if the number of the times of calibration is reduced in order to shorten the time for calibration, it becomes difficult to maintain a desirable constant accuracy. Therefore, there have been insolvable problems conflicting with each other between the calibration time and the number oft he times of calibration.

DISCLOSURE OF THE INVENTION

Accordingly, an object of the present invention is to provide a chip mounting device and a calibration method therein wherein the number of the times of calibration can be decreased because each calibration can be carried out at an optimum timing, thereby performing each calibration efficiently, and a further high-accuracy calibration can be carried out without being influenced by the mechanical deformation of a movement control mechanism for a recognition means.

To achieve the above-described object, a chip mounting device according to the present invention comprises a first recognition mark on a chip-retainable head side and a second recognition mark on a substrate-retainable stage side, the first and second recognition marks being vertically apart from each other; a first recognition means for recognizing the first recognition mark and a second recognition means for recognizing the second recognition mark; a third recognition means for recognizing the first and second recognition marks concurrently when the first recognition mark is brought close to or into contact with the second recognition mark; and a temperature detection means for detecting a beyond-allowance temperature change to output a signal for initiating a calibration based on the concurrent recognition of the recognition marks.

A calibration method in a chip mounting device according to the present invention comprises the steps of recognizing a first recognition mark on a chip-retainable head side and a second recognition mark on a substrate-retainable stage side, the first and second recognition marks being vertically apart from each other; bringing the first recognition mark close to or into contact with the second recognition mark; concurrently recognizing the first and second recognition marks which have been brought close to or into contact with each other; and detecting a beyond-allowance temperature change to output a signal for initiating a calibration based on the concurrent recognition of the recognition marks.

Further, in the present invention, it is possible to concurrently recognize the first and second recognition marks without using a third recognition means. Namely, another calibration method in a chip mounting device according to the present invention comprises the steps of concurrently recognizing a first recognition mark on a chip-retainable head side and a second recognition mark on a substrate-retainable stage side, the first and second recognition marks being vertically apart from each other; and detecting a beyond-allowance temperature change to output a signal for initiating a calibration based on the concurrent recognition of the recognition marks.

In such chip mounting device and calibration method according to the present invention, the first and second recognition marks are concurrently recognized at a condition where they are brought close to or into contact with each other or at a condition where they are vertically apart from each other, the calibration is carried out based on the result of the concurrent recognition, and the actual calibration is performed only when a beyond-allowance temperature change is detected. A high-accuracy reading becomes possible by the concurrent recognition, and a calibration at an optimum timing can be carried out only when the calibration is required, by outputting a signal for initiating the calibration based on the detection of a beyond-allowance temperature change.

Therefore, according to the present invention, the calibration time can be shortened, a high-accuracy calibration can be carried out without being influenced by a mechanical deformation resulted by a moment caused from a positional difference between a position when the alignment of a substrate relative to a chip is carried out and a position when the calibration is carried out, and besides, the calibration can be carried out at an optimum timing and the number of the times of calibration can be reduced. As a result, the calibration can be carried out efficiently, and the accuracy of the calibration can be maintained constant, namely, the high accuracy can be maintained even when the temperature in the environmental atmosphere varies. Furthermore, because the number of the times of the calibration can be reduced while maintaining the high accuracy, the productivity can also be improved.

BRIEF EXPLANATION OF THE DRAWINGS

FIG. 14 shows an embodiment of a chip mounting device without a third recognition means.

FIG. 15 shows another embodiment of a chip mounting device without a third recognition means.

FIG. 16 shows a further embodiment of a chip mounting device without a third recognition means.

THE BEST MODE FOR CARRYING OUT THE INVENTION

Hereinafter, desirable embodiments of the present invention will be explained referring to figures.

Figure 1:
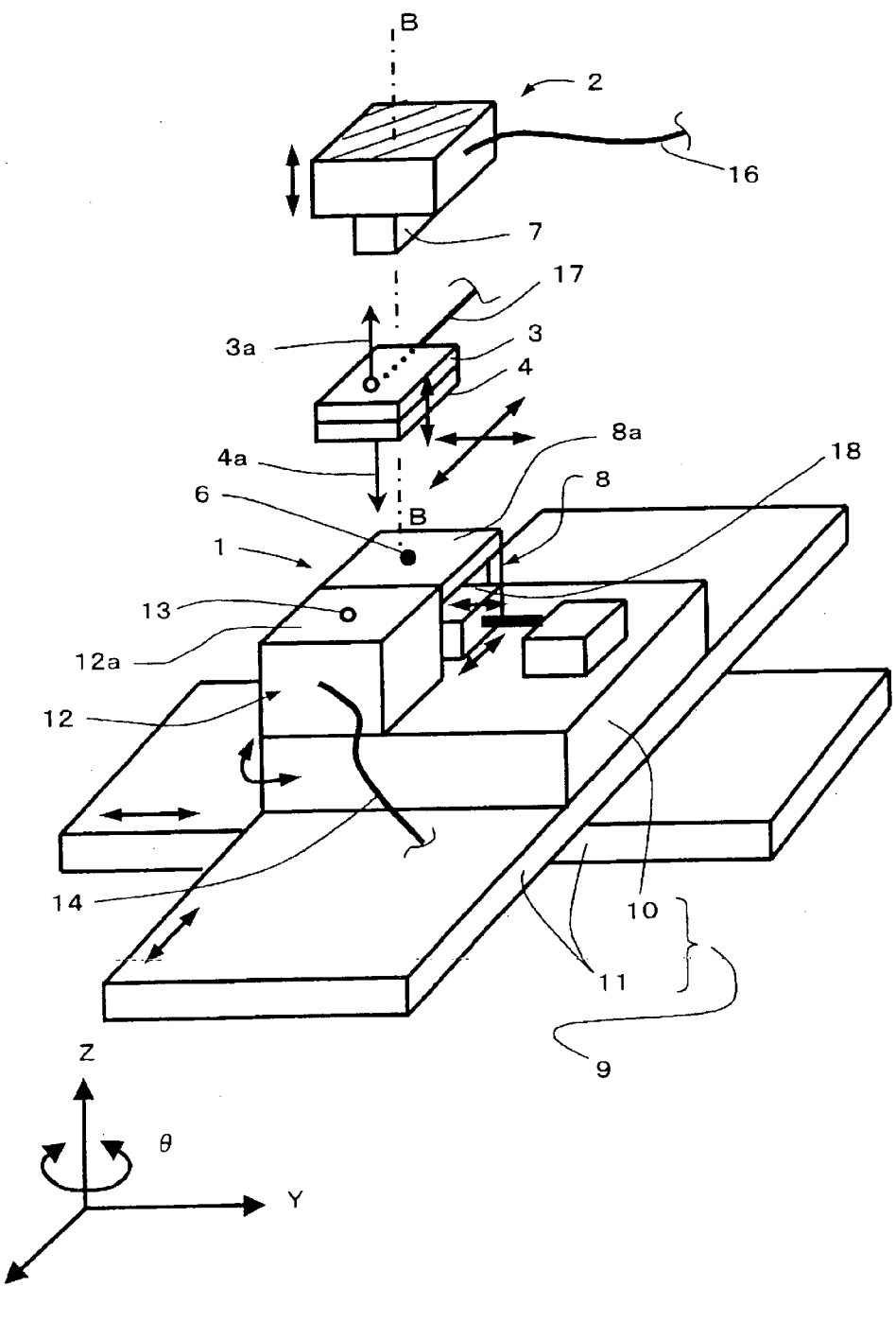
FIG. 1 is a perspective view of a chip mounting device according to an embodiment of the present invention, showing a state for recognizing first and second recognition marks by first, second and third recognition means.
Figure 2:
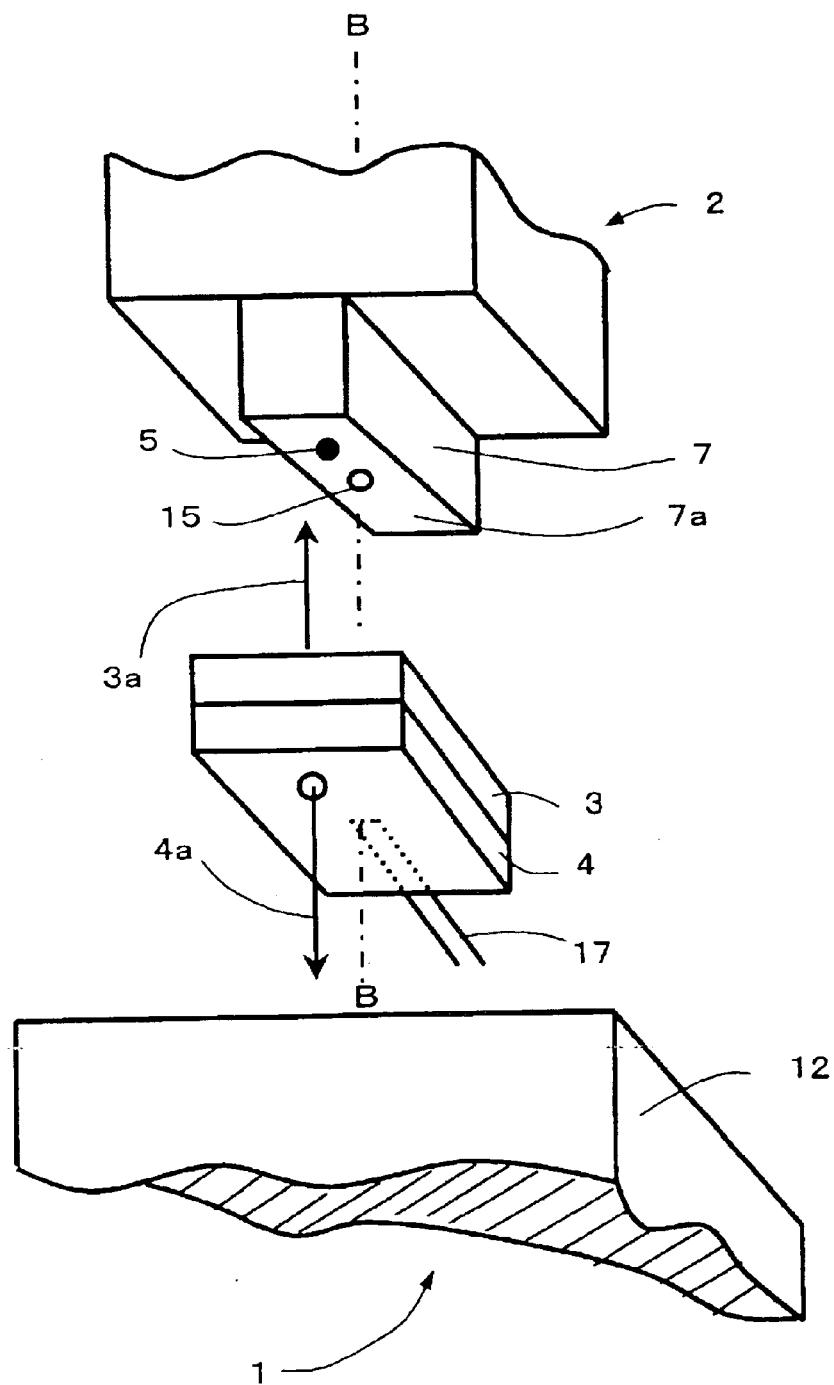
FIG. 2 is a perspective view showing a state for recognizing first and second recognition marks by first and second recognition means which are formed as a two-sight recognition means.

FIGS. 1 and 2 show a chip mounting device according to an embodiment of the present invention. In FIGS. 1 and 2, a state is shown wherein a first recognition means 3 (for example, a CCD camera) and a second recognition means 4 (for example, a CCD camera) are moved to a position between a lower stage 1 and an upper head 2, and the first recognition means 3 and the second recognition means 4 are attached so as to be integrally moved, namely, attached in a form of a two-sight recognition means.

Therefore, first recognition means 3 can recognize a first recognition mark 5 of upper side, and second recognition means 4 can recognize a second recognition mark 6 of lower side. First recognition mark 5 is provided on a pressing surface 7a of a tool 7 forming a tip portion of head 2, and second recognition mark 6 is provided on an upper surface 8a of a mark recognition part 8 of stage 1.

Stage 1 is attached onto a rotary table 10 which forms an uppermost stage of a movable table 9. Movable table 9 is constructed so as to be rotatable in a predetermined direction (θ direction in the figure) by attaching rotary table 10 onto a parallel translation table 11 which can be moved in X-axis direction, Y-axis direction, or both of X and Y axes directions (hereinafter, referred to as merely "parallel translation"). Therefore, stage 1 can be translated in parallel and/or rotated in predetermined directions by controlling the drive of movable table 9.

Stage 1 forms mark recognition part 8 and a substrate retaining part 12, the mark recognition part 8 is constructed from a transparent or transmitting material, and the substrate retaining part 12 opens a substrate-retaining suction hole 13 for retaining a substrate (for example, a liquid crystal panel) by suction, on an upper surface 12a of the part 12. Further, one end of a pressure-proof hose 14 is attached to substrate retaining part 12 so as to be communicated with substrate-retaining suction hole 13, and the other end thereof is attached to a vacuum pump which is not shown.

On the other hand, head 2 cannot be translated in parallel and/or rotated but is provided free to be moved in Z direction (in a vertical direction). Head 2 incorporates a heater (not shown) therein for heating pressing surface 7a of tool 7 at a predetermined temperature, and a small chip-retaining suction hole 15 for retaining a chip by suction is opened on pressing surface 7a.

Chip-retaining suction hole 15 provided as a chip retaining means is positioned on the vertical axis B—B of head 2, one end of a pressure-proofhose 16 is attached to tool 7 so as to be communicated with this suction hole 15, and the other end of the hose is attached to a vacuum pump which is not shown.

First and second recognition means 3 and 4 provided as an integral form is attached to, for example, a movable table (not shown) capable of being controlled in parallel translation and vertical movement. Therefore, first and second recognition means 3 and 4 can be moved together from its retraction position to a position between lower stage 1 and upper head 2 by controlling the movement of the above-described movable table in a horizontal direction, and can be moved therefrom to the retraction position in the contrary direction. At that time, the vertical positions of first recognition means 3 and second recognition means 4 are adjusted at predetermined positions by controlling the vertical movement of the above-described movable table.

Further, a temperature detection means 17 (for example, a thermocouple) is attached to first recognition means 3 or second recognition means 4. Where, "a temperature detection means 17 is attached to first recognition means 3 or second recognition means 4" includes a case where the temperature detection means 17 is provided at a boundary between the stacked first recognition means 3 and second recognition means 4.

Since substrate-retaining suction hole 13 as a substrate-retaining means is provided at a position far away from second recognition mark 6 with a predetermined distance, even if a substrate is retained on upper surface 12a of substrate-retaining part 12, the second recognition mark 6 is not covered with the substrate (is not positioned under the substrate) and it is exposed. A third recognition means 18 (for example, a CCD camera) is attached onto rotary table 10 of movable table 9 so as to be translated in parallel.

Therefore, stage 1 can be positioned at a position for carrying out a calibration by the control of the parallel translation and/or the rotation of movable table 9, as shown in the figure. This position for carrying out a calibration is set within the sights of first recognition means 3 and second recognition means 4, namely, at a predetermined position within a range in which both recognition means 3 and 4 can recognize both first and second recognition marks 5 and 6. This setting is carried out as needed, and it may be omitted in a case where both first and second recognition marks 5 and 6 are present within the sights of first recognition means 3 and second recognition means 4.

As shown in the figure, at a state where first recognition mark 5 on the head side and second recognition mark 6 on the stage side are vertically apart from each other, first recognition means 3 and second recognition means 4 are moved together to a position between head 2 moved to an upper stand-by position and stage 1 positioned therebelow.

Then, first and second recognition marks 5 and 6 are recognized concurrently by both recognition means 3 and 4, and a calibration is carried out based on the control parameters obtained by the recognition. Namely, by this, the control parameters having been previously input into the movement control system of first and second recognition means 3 and 4 are corrected and renewed.

At that time, because first recognition mark 5 is provided at a position close to chip-retaining suction hole 15, prior to bonding (heat bonding), first and second recognition means 3 and 4 are controlled in movement at almost the same stroke as that in a case where a recognition mark for mounting (an alignment mark) of a chip retained by head 2 and a recognition mark for mounting (an alignment mark) of a substrate retained by lower stage 1 are recognized by the first and second recognition means 3 and 4. Thus, because all marks are recognized at almost the same stroke position, the recognition does not receive the influence of a deflection due to a load difference.

Thereafter, when first and second recognition means 3 and 4 are moved from the mark recognition position between head 2 and stage 1 to the right-side retraction position, head 2 is moved down from the upper stand-by position, and by this operation, pressing surface 7a of tool 7 of head 2 is brought close to or into light contact with upper surface 8a of mark recognition part 8 of stage 1.

Then, first and second recognition marks 5 and 6 are recognized concurrently by third recognition means 18 positioned at the lower-surface side of mark recognition part 8, and the previous control parameters input into the movement control system are corrected and renewed based on the control parameters obtained by this concurrent recognition.

Where, through a series of operations in the above-described mark recognition, an amount of a shift between optical axis 3a of first recognition means 3 and optical axis 4a of second recognition means 4, which are provided in a form of a two-sight recognition means, is also determined, and the previous control parameters are corrected and renewed based on the control parameters obtained by the determination.

The calibration utilizing third recognition means 18 is carried out against a deformation of the position of the stage or the head, and therefore, this calibration may be carried out at a frequency less than that of a calibration utilizing a two-sight recognition means (integrally formed first and second recognition means) with a high deformation frequency in the optical system.

Thus, a calibration utilizing a two-sight recognition means (first and second recognition means 3 and 4) and a calibration utilizing third recognition means 18 are carried out at two stages. Therefore, while the troublesomeness on the movement control of the recognition means is prevented, a further high-accuracy calibration can be carried out as compared with the conventional calibration. Further, because the number of times of the movement control of the recognition means is reduced as described above, the time required for the calibration can be shortened.

Such a calibration is carried out at an appropriate timing as needed, during the mounting operation in which chips are successively mounted (thermally bonded) onto substrates such as liquid crystal panels retained on stage 1. Where, the calibration is carried out only when temperature detection means 17 attached to first recognition means 3 or second recognition means 4 detects a beyond-allowance temperature change.

Therefore, even if first recognition means 3 and second recognition means 4 are moved to a position between head 2 and stage 1, when temperature detection means 17 does not detect a beyond-allowance temperature change relative to the temperature at which the last calibration has been carried out, the above-described calibration is not carried out.

As a result, the calibration can be carried out at an optimum timing, the number of the times of the calibration can be reduced, and therefore, the calibration can be carried out efficiently, and besides, the accuracy of the calibration can be maintained constant, namely, the high accuracy for the calibration can be maintained even in a case where the temperature of the environmental atmosphere changes.

In other words, because an allowable temperature change is set based on that an amount of shift α between optical axis 3a of first recognition means 3 and optical axis 4a of second recognition means 4 has a correlation with the temperatures of the first and second recognition means 3 and 4, the above-described advantage can be obtained.

Figure 3:
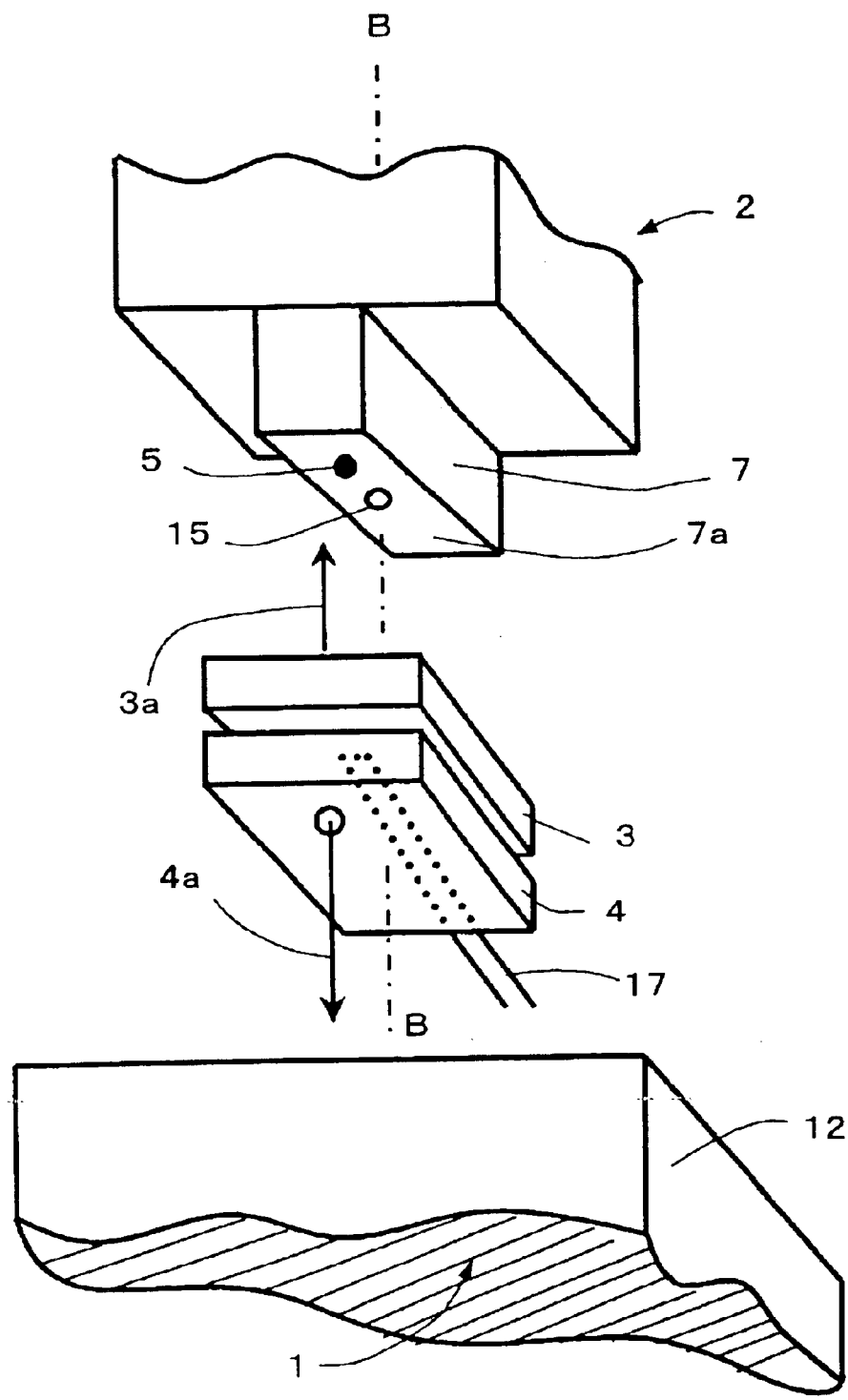
FIG. 3 is a perspective view showing a state for recognizing first and second recognition marks by first and second recognition means which are structured in a form separated from each other.

In the present invention, as shown in FIG. 3, first recognition means 3 for recognizing a first recognition mark 5 and second recognition means 4 for recognizing a second recognition mark 6 may be attached so that they are controlled in movement independently of each other. When they are thus attached, however, because the movement control thereof becomes troublesome and the time for calibration may become long or the accuracy for mark recognition may deteriorate, it is preferred to move them integrally, namely, to attach them in a form of a two-sight recognition means as aforementioned.

Further, as aforementioned, if a shift between the optical axes of both recognition means occurs in a two-sight recognition means, the correction thereof is required, and a correction parameter therefor is required. In the conventional technology with respect to this correction parameter, as aforementioned, because the correction parameter is determined experientially from the result of the measurement of the accuracy of the recognition means and the like and it is likely to be influenced by a change of season (a temperature change in environmental atmosphere) and the like, it is difficult to maintain the calibration accuracy constant, and if the calibration accuracy is tried to be maintained constant, the time for the calibration may become long and the efficiency may reduce, and if the number of the times of calibration is reduced in order to shorten the time for calibration, it becomes difficult to maintain a desirable constant accuracy. Thus, there have been insolvable problems conflicting with each other. However, in the present invention, such problems can be solved.

With respect to the setting of the allowable temperature change, as the result that a heating test was carried out for a plurality of recognition means and the correlation between the amounts of temperature change "t" and the amounts of shift between optical axes was determined, although a slight dispersion was present, it was confirmed that an average amount of shift of optical axes per 1° C. of temperature change was in a range of about 2 to about 6 μm. Therefore, a method for calculating a temperature change getting out from an allowable accuracy of shift of optical axes based on the data and setting the calculated temperature change as an allowable temperature change may be employed as an example.

As is well known, when first and second recognition means 3 and 4 attached in a form of a two-sight recognition means are influenced by a temperature in the environmental atmosphere and the like, a shift α occurs between upper optical axis 3a and lower optical axis 4a. Therefore, because the shift is measured beforehand and a value of an allowable temperature change can be calculated from the allowable value of the measured shift α, the device can be designed so that the temperature of the recognition means is measured by an appropriate temperature detection means such as a thermocouple and only when the temperature change is more than the value corresponding to the allowable accuracy, the calibration is carried out.

Different from the above description, in a case where a chip is mounted (thermally bonded) to a substrate, stage 1 is moved to a position different from the position for the calibration, namely, to a position for carrying out the mounting, and this is carried out by controlling the drive of movable table 9. When the stage is moved to the position for carrying out the mounting, a recognition mark for mounting (an alignment mark) of a substrate retained on substrate-retaining part 12 via substrate retaining suction hole 13 of stage 1 is recognized by second recognition means 4, and a recognition mark for mounting (an alignment mark) of a chip (not shown) retained on head 2 via chip-retaining suction hole 15 is recognized by first recognition means 3.

Then, substrate-retaining stage 1 is translated in parallel and/or rotated to conform the positions of both marks, and by this, the chip is precisely positioned at a position of the substrate to be mounted with the chip, and thereafter, the predetermined mounting (heat bonding) is carried out by moving head 2 down.

Although an embodiment of the present invention has been described herein above, in the present invention, first recognition means 3 for recognizing first recognition mark 5 and second recognition means 4 for recognizing second recognition mark 6 may be attached so as to be controlled in movement independently of each other, except a structure wherein these recognition means are attached so as to be integrally moved (attached in a form of a two-sight recognition means).

Further, in a case where first and second recognition means 3 and 4 are attached in a form of a two-sight recognition means, whichever of the calibration utilizing it or the calibration utilizing third recognition means 18 may be carried out in advance.

Furthermore, not only the method for carrying out the calibration utilizing a two-sight recognition means (first and second recognition means 3 and 4) and the calibration utilizing third recognition means 18 together, but also a method for carrying out the calibration utilizing third recognition means 18 before or after the calibration utilizing a two-sight recognition means (first and second recognition means 3 and 4) intermittently may be employed.

In a case where first and second recognition means 3 and 4 are attached so as to be controlled in movement independently of each other, the calibration utilizing first recognition means 3, the calibration utilizing second recognition means 4 and the calibration utilizing third recognition means 18 may be carried out in any order.

In the present invention, head 2 is not limited to a head having a heater, and in a case where heat bonding is not performed, a head without a heater can be selected. Head 2 may be attached at least so as to be vertically moved, and therefore, the head may be attached free to be translated in parallel and/or rotated in addition to the vertical movement, as needed. For example, the head may be attached so as to be vertically moved, translated in parallel and rotated, or, so as to be vertically moved and translated in parallel.

Figure 4:
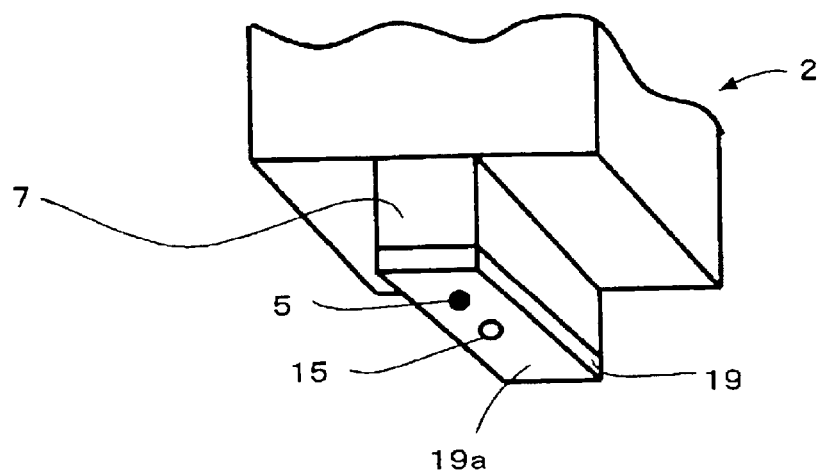
FIG. 4 is a perspective view showing another form of a head.
Figure 11:
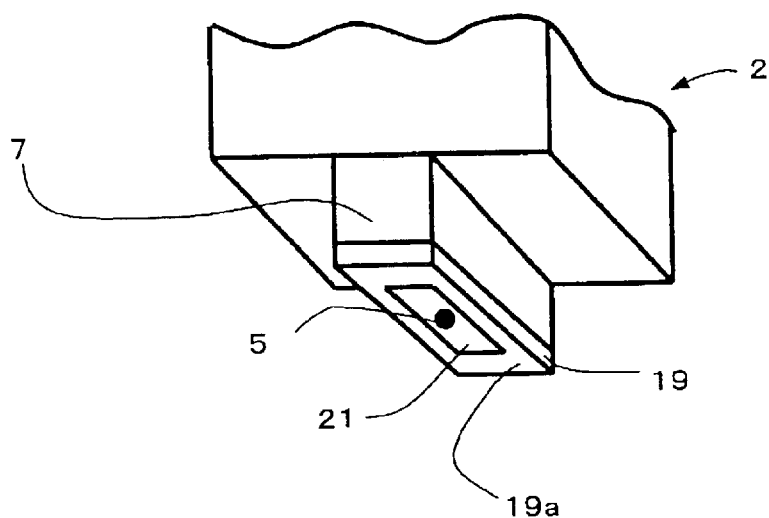
FIG. 11 is a perspective view showing another embodiment for retaining a chip.

Further, also as to the structure thereof, it is not limited to the structure wherein first recognition mark 5 is provided directly to pressing surface 7a of tool 7 as shown in FIGS. 2 and 3, and it may be employed as a structure wherein first recognition mark 5 is provided to an attachment 19 attached to tool 7 as shown in FIGS. 4 and 11. In this example, attachment 19 opens chip-retaining suction hole 15 as a chip-retaining means on a pressing surface 19a provided with first recognition mark 5, and is attached to tool 7 detachably by a vacuum suction means. Therefore, because a desirable attachment can be selected and thereto an attachment to be attached can be exchanged in correspondence with various conditions such as the kind and the size of a chip to be retained on pressing surface 19a and the space for mounting of a substrate, the chip mounting device can be generalized. Where, means for attaching an attachment to tool 7 detachably is not limited to a vacuum suction means, and other means, for example, a magnetically retaining means, may be employed.

Further, also as to the structure of stage 1, although generally it is attached free to be translated in parallel and/or rotated, it may be attached in a form combining a vertical movement with these movements, as needed. For example, the stage may be attached so as to be translated in parallel, rotated and vertically moved, or, so as to be translated in parallel and vertically moved. Further, it may be attached so as to be only vertically moved, and as the case may be, it may be attached in a form of a fixed stage.

Figure 5:
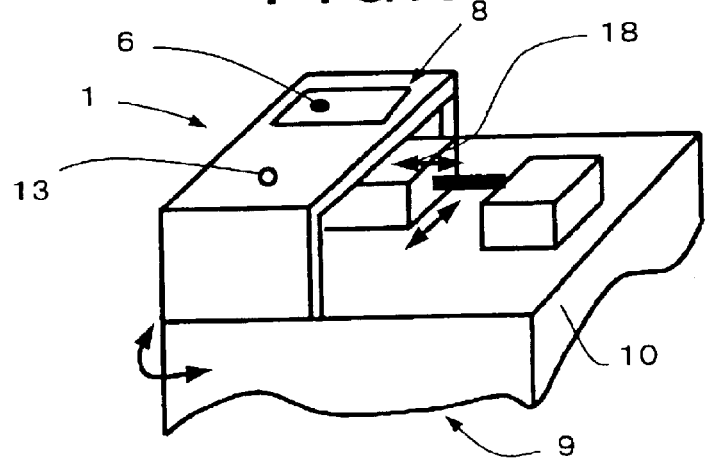
FIG. 5 is a perspective view showing another form of a stage.
Figure 6:
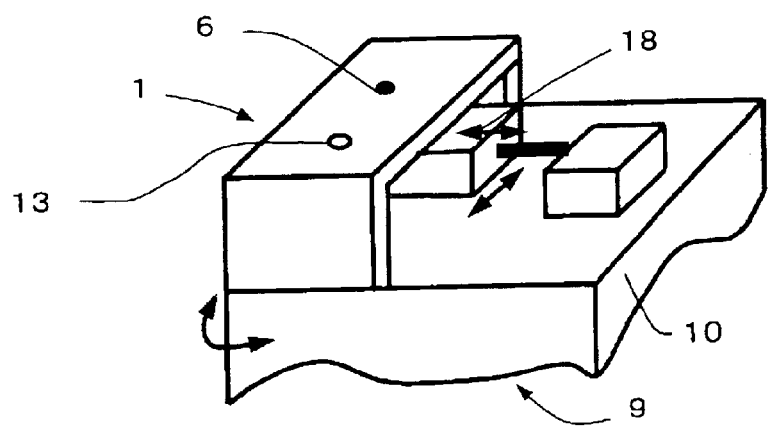
FIG. 6 is a perspective view showing a further form of a stage.
Figure 7:
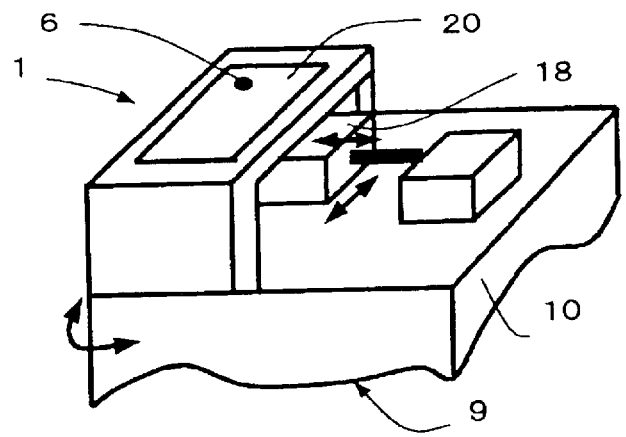
FIG. 7 is a perspective view showing an embodiment for retaining a substrate.
Figure 8:
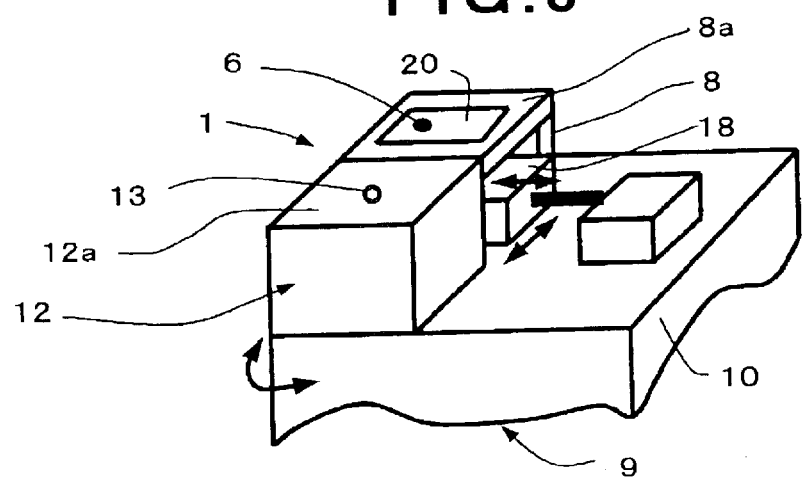
FIG. 8 is a perspective view showing another embodiment for retaining a substrate.
Figure 9:
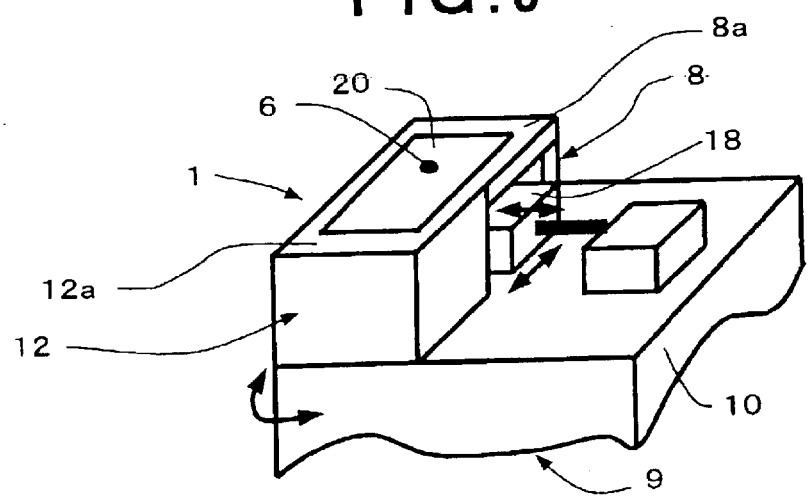
FIG. 9 is a perspective view showing a further embodiment for retaining a substrate.

The structure thereof is not limited to the structures shown in FIGS. 1, 8 and 9, and it may be employed as a structure shown in FIG. 5, 6 or 7. Stage 1 shown in FIGS. 6 and 7 is constructed entirely from a transparent or transmitting material. Further, although generally a heater (not shown) is incorporated into substrate-retaining part 12, it may be omitted as needed. This is similarly adapted to stage 1 shown in FIGS. 6 and 7.

As is evident evident from the above-described explanation, the present invention includes a recognition aspect according to the combination of the respective heads 2 provided with chip-retaining suction hole 15 and first recognition mark 5 shown FIGS. 2, 3 and 4 and the respective stages 1 provided with substrate-retaining suction hole 13 and second recognition mark 6 shown FIGS. 1, 5 and 6, namely, a first aspect for recognizing first recognition mark 5 provided to head 2 and second recognition mark 6 provided to stage 1.

Further, in the present invention, as shown in FIGS. 7, 8 and 9, second recognition mark 6 may be provided to a substrate 20 retained by stage 1. Therefore, the present invention includes a recognition aspect according to the combination of the respective heads 2 provided with chip-retaining suction hole 15 and first recognition mark 5 shown FIGS. 2, 3 and 4 and the respective stages 1 provided with only substrate-retaining suction hole 13 shown in FIGS. 7, 8 and 9, namely, a second aspect for recognizing first recognition mark 5 provided to head 2 and second recognition mark 6 provided to substrate 20 retained by stage 1.

In these first and second aspects, first recognition mark 5 is provided separatedly from chip-retaining suction hole 15. In the present invention, however, without providing them separatedly, they may be formed as a suction hole for retaining a chip and recognizing a first recognition mark. Although this embodiment is not depicted, it is understood as an aspect in which first recognition mark 5 is deleted from FIGS. 2, 3 or 4.

Figure 10:
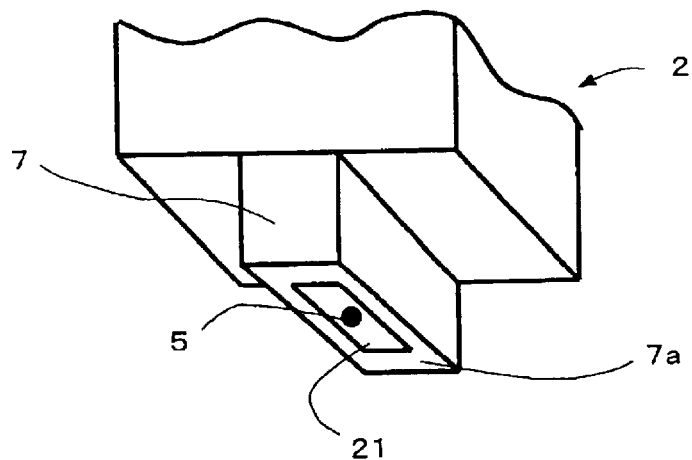
FIG. 10 is a perspective view showing an embodiment for retaining a chip.

Further, in the present invention as shown in FIGS. 10 and 11, first recognition mark 5 may be provided to a chip 21 retained by head 2. Therefore, the present invention includes a recognition aspect according to the combination of the respective heads 2 provided with only chip-retaining suction hole 15 shown FIGS. 10 and 11 and the respective stages 1 provided with substrate-retaining suction hole 13 and second recognition mark 6 shown FIGS. 1, 5 and 6, namely, a third aspect for recognizing first recognition mark 5 provided to chip 21 retained by head 2 and second recognition mark 6 provided to stage 1.

Furthermore, the present invention includes a recognition aspect according to the combination of the respective heads 2 shown FIGS. 10 and 11 and the respective stages 1 shown FIGS. 7, 8 and 9, namely, a fourth aspect for recognizing first recognition mark 5 provided to chip 21 retained by head 2 and second recognition mark 6 provided to substrate 20 retained by stage 1.

Figure 12:
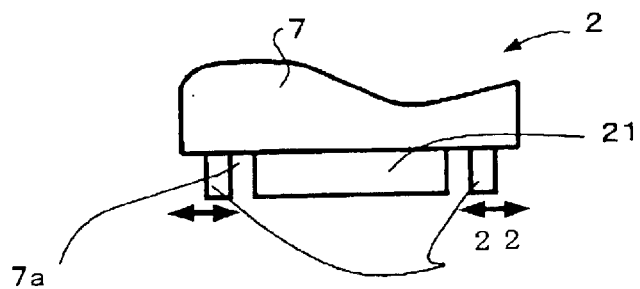
FIG. 12 is a side view showing a further embodiment for retaining a chip.
Figure 13:
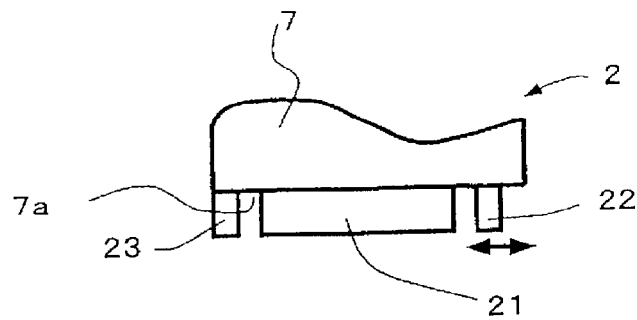
FIG. 13 is a side view showing a still further embodiment for retaining a chip.

The chip-retaining means of head 2 is not limited to the above-described vacuum suction-type retaining means (corresponding to chip-retaining suction hole 15), and it may be formed as claw-type chip-retaining means shown in FIGS. 12 and 13. The means shown in FIG. 12 is constructed for retaining chip 21 by a pair of movable claws 22. The means shown in FIG. 13 is constructed for retaining chip 21 by a fixed claw 23 and a movable claw 22. Any type retaining means other than the above-described means, for example, an electrostatic-type means or a magnetic-type means, may be employed.

Further, in a case of head 2 having such a chip-retaining means, if first recognition mark 5 is provided on pressing surface 7a, the mark recognition can be carried out similarly to that in the above-described first or second aspect, and if first recognition mark 5 is provided on the retained chip 21, the mark recognition can be carried out similarly to that in the above described third or fourth aspect.

Furthermore, the substrate-retaining means of stage 1 also is not limited to the above described vacuum suction-type retaining means (corresponding to substrate-retaining suction hole 13), and similarly to the chip-retaining means of head 2, it may be formed as means for retaining substrate 20 by a pair of movable claws 22, or means for retaining substrate 20 by a fixed claw 23 and a movable claw 22, or any other type retaining means such as an electrostatic-type means or a magnetic-type means.

Chip-retaining suction hole 15 of head 2 and substrate-retaining suction hole 13 of stage 1 are provided by a required number as needed, respectively. The substrate-retaining suction hole 13 is provided also to mark recognition part 8, as needed.

Further, first, second and third recognition means 3, 4 and 18 may be formed as any type means as long as the means is suitable for recognizing recognition marks, such as an infrared-ray camera, an X-ray camera or other appropriate sensors except a CCD camera. Mark recognition part 8 of stage 1 may be constructed from a predetermined transparent or transmitting material in accordance with a selected third recognition means 18. Although this matter is also applied to the case shown in FIG. 6, generally, when a CCD camera is used, it is made of a transparent glass material, and when an infrared-ray camera or an X-ray camera is used, it is made of a germanium material or a silicon material.

Further, temperature detection means 17 may be formed from, for example, a resistance temperature sensor or a radiation thermometer, except a thermocouple. Also as to its attachment, except the embodiment wherein it is attached to first recognition means 3 or second recognition means 4, may be employed an embodiment wherein the means is provided separatedly from first and second recognition means 3 and 4, for example, the means is provided at a position around first and second recognition means 3 and 4 (or around the chip mounting device). In such a case, the means may be provided so as to be moved independently of first and second recognition means 3 and 4, as needed. Further, the means may be attached to the aforementioned movable table attached with first and second recognition means 3 and 4. In accordance with such types in attachment, temperature detection means 17 detects a temperature change in the mounting device itself or the environmental atmosphere around the mounting device.

Temperature detection means 17 may be provided not only at a single number but also at a plural number. In such a case, the formation in disposition thereof is appropriately selected as needed, for example, from a form in which the means are disposed concentratively at a same position and a form in which the means are disposed dispersively at positions different from each other. In such a case where a plurality of temperature detection means 17 are provided, the respective temperature detection means 17 may detect respective temperature changes (temperature changes in environmental atmosphere) and by determining the detected results totally, it may be determined whether the present condition is a condition of a beyond-allowance temperature change for outputting a signal for initiating the calibration or not.

Further, first recognition mark 5 may be any type mark. Although generally a resin printed mark having a heat resistance against the heating of head 2 and/or stage 1 is selected, other marks, for example, a hole mark or a groove mark, may be employed.

When this mark is provided to pressing surface 7a of tool 7 or pressing surface 19a of attachment 19 (refer to FIGS. 2, 3 and 4), it may be disposed at any position thereof However, in a case where the mark is provided within an area of the pressing surface which is covered with a chip to be retained, the mark may be provided at a very thin form so that the parallelism of the chip is not deteriorated, or a heat-resistant plate provided with the mark may be fixed in a recessed portion formed on the pressing surface. Also in a case where the mark is provided to chip 21 (refer to FIGS. 10 and 11), it may be disposed at any position thereof.

In the present invention, a "chip" means an object to be bonded to a substrate, such as an IC chip, a semiconductor chip, a wafer, or electronic parts such as an optoelectronic element, and any type chip may be employed.

Further, a "substrates" means an object to be bonded with the above-described chip, and any type substrate may be employed, such as a resin substrate, a glass substrate, or various types of chips and wafers. However, as shown in FIGS. 7, 8 and 9, in a case where second recognition mark 6 of substrate 20 retained by stage 1 is recognized, it is necessary to select a substrate made of a specified material through which third recognition means 18 can recognize the mark.

Further, a "chip mounting device" means a mounting device for mounting various types of chips, a bonding device for bonding them and the like, and it means a device with a broad concept including devices of a thermally pressing type and a simple pressing type (or an adhesive type).

Although it is preferred that a calibration is carried out by utilizing first, second and third recognition means 3, 4 and 18 and temperature detection means 17 as described above, as needed, the calibration may be carried out by utilizing only first and second recognition means 3 and 4 and temperature detection means 17. In this case, although third recognition means 18 is attached, it is not used.

Further, as the case may be, third recognition means 18 may not be attached. Embodiments of such a case are shown in FIGS. 14A, 15A and 16A.

Figure 14A:
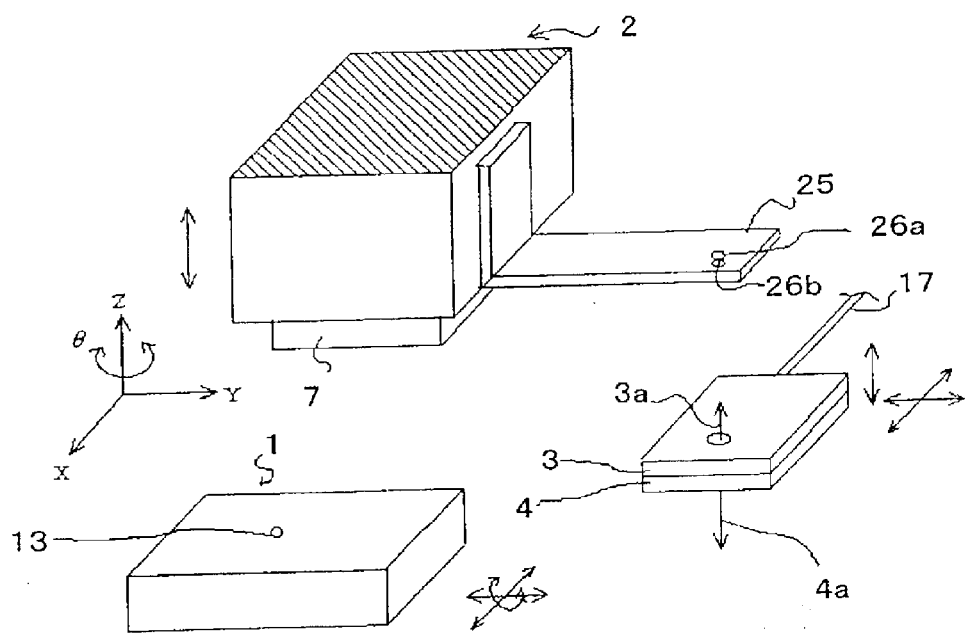
FIG. 14A is a perspective view showing a structure of the device.

In FIG. 14A, an upper-side recognition mark 26a is provided on the upper surface of a mark jig 25 attached to head 2, and a lower-side recognition mark 26b is provided on the lower surface of the jig. Therefore, when temperature detection means 17 a beyond-allowance temperature change, first and second recognition means 3 and 4 provided in a form of a two-sight recognition means are moved together from the retraction position to a position below the lower surface of mark jig 25, and recognition mark 26b can be recognized by upper optical axis 3a of first recognition means 3.

Figure 14B:
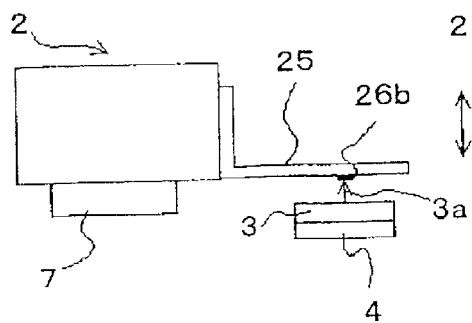
FIG. 14B is an elevational view showing a state for recognizing a recognition mark by a first recognition means.
Figure 14C:
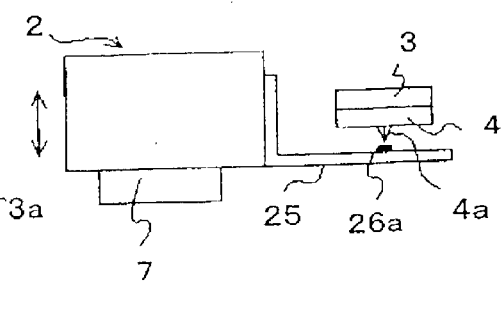
FIG. 14C is an elevational view showing a state for recognizing a recognition mark by a second recognition means.

This state is shown in FIG. 14B, and after recognition mark 26b is recognized, first and second recognition means 3 and 4 are retracted together therefrom (retracted to a position which does not obstruct the downward movement of mark jig 25). Then, head 2 is moved down, and thereafter, first and second recognition means 3 and 4 are moved together to the upper surface side of mark jig 25, and recognition mark 26a is recognized by lower optical axis 4a of second recognition means 4. This state is shown in FIG. 14C. Where, because recognition marks 26a and 26b are disposed at the respective predetermined positions (reference positions) on an identical vertical axis, an amount of a shift between upper optical axis 3a and lower optical axis 4a is an amount of shift from the vertical axis. Therefore, it may be determined.

Figure 15A:
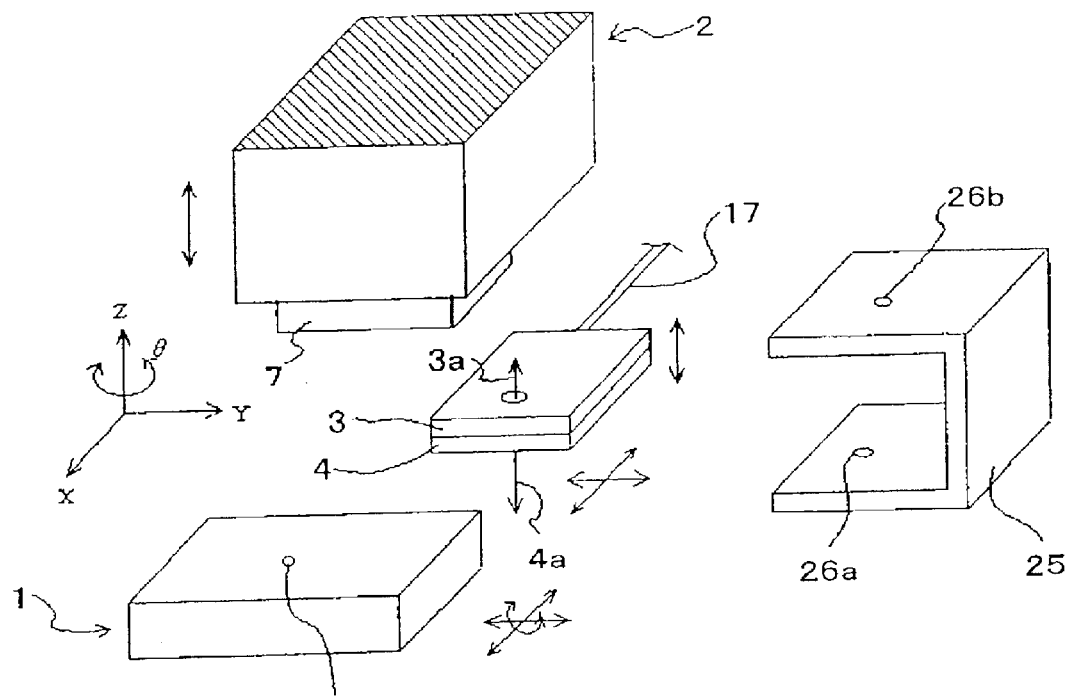
FIG. 15A is a perspective view showing a structure of the device.
Figure 15B:
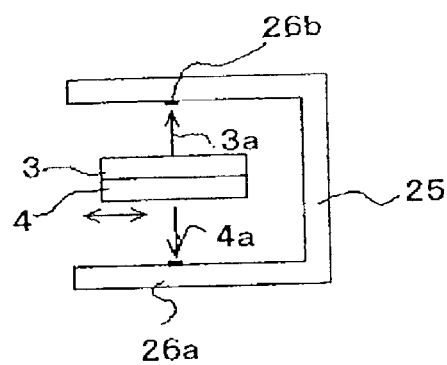
FIG. 15B is an elevational view showing a state for recognizing recognition marks by first and second recognition means.
Figure 16A:
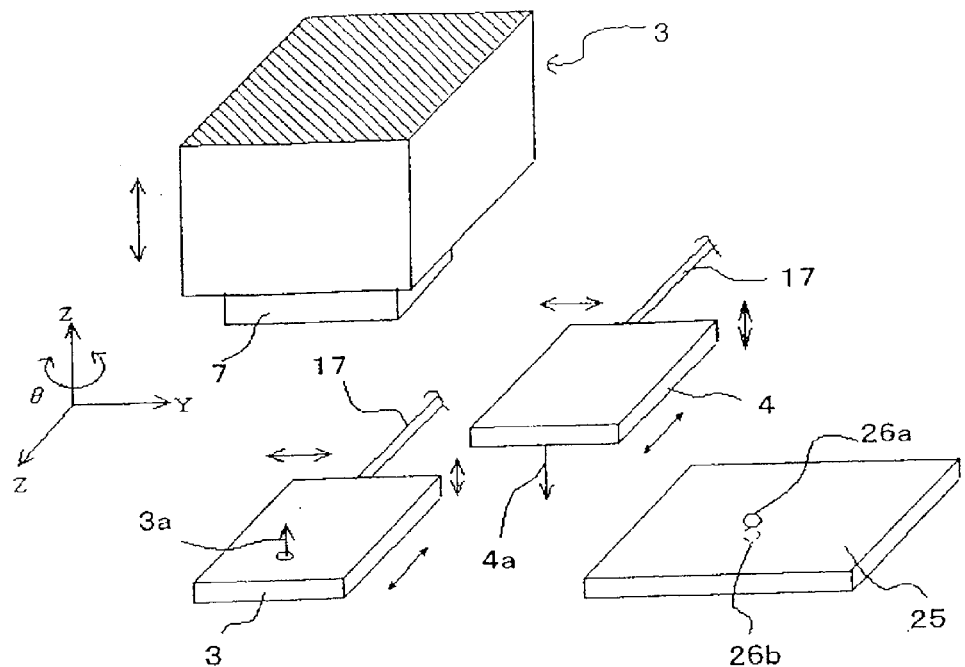
FIG. 16A is a perspective view showing a structure of the device.
Figure 16A:
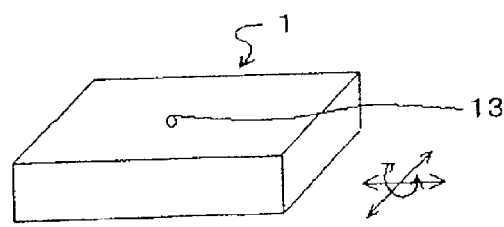

Different from the above-described embodiment shown in FIG. 14A, in FIG. 15A, mark jig 25 is disposed at a predetermined position separatedly from and independently of head 2, recognition mark 26b is provided on the upper surface formed in a concave portion of this mark jig 25, and recognition mark 26a is provided on the lower surface formed in the concave portion. In this structure, if temperature detection means 17 detects a beyond-allowance temperature change, as shown in FIG. 15B, first and second recognition means 3 and 4 are moved together into the concave portion of mark jig 25, and recognition mark 26b can be detected by upper optical axis 3a of first recognition means 3 and recognition mark 26a can be detected by lower optical axis 4a of second recognition means 4. Therefore, also in this embodiment, similarly to in the embodiment shown in FIG. 14A, an amount in shift between upper optical axis 3a and lower optical axis 4a can be determined.

Figure 16B:
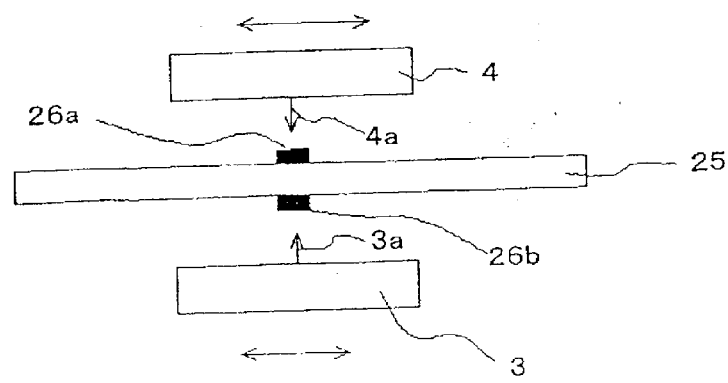
FIG. 16B is an elevational view showing a state for recognizing recognition marks by first and second recognition means.

Further, FIG. 16A shows another embodiment. In this embodiment, first and second recognition means 3 and 4 are attached so as to be translated in parallel and/or vertically moved independently of each other, and temperature detection means 17 is attached to each of the first and second recognition means 3 and 4. Although mark jig 25 is disposed at a predetermined position separately from and independently of head 2 similarly to that shown in FIG. 15A, recognition mark 26a is provided on the upper surface of this mark jig 25, and recognition mark 26b is provided on the lower surface of the mark jig 25. In this structure, if any one of temperature detection means 17 detects a beyond-allowance temperature change, as shown in FIG. 16B, first recognition means 3 is moved to the lower-surface side of mark jig 25 and second recognition means 4 is moved to the upper-surface side of the mark jig 25, and recognition mark 26b can be detected by upper optical axis 3a of first recognition means 3 and recognition mark 26a can be detected by lower optical axis 4a of second recognition means 4. Therefore, also in this embodiment, similarly to in the embodiments shown in FIGS. 14A and 15A, an amount in shift between upper optical axis 3a and lower optical axis 4a can be determined.

Even in the above-described embodiments shown in FIGS. 14A, 15A and 16A, various modifications can be employed.

For example, temperature detection means 17 may be provided not only at a single number but also at a plural number. In such a case, the formation in disposition thereof is appropriately selected as needed, for example, from a form in which the means are disposed concentratively at a same position and a form in which the means are disposed dispersively at positions different from each other. In such a case where a plurality of temperature detection means 17 are provided, the respective temperature detection means 17 may detect respective temperature changes in environmental atmosphere and by determining the detected results totally, it may be determined whether the present condition is a condition of a beyond-allowance temperature change for outputting a signal for initiating the calibration or not.

Also as to the attachment of temperature detection means 17, except the embodiment wherein it is attached to first recognition means 3 or second recognition means 4, may be employed an embodiment wherein the means is provided separatedly from first and second recognition means 3 and 4, for example, the means is provided at a position around first and second recognition means 3 and 4 (or around the chip mounting device). In such a case, the means may be provided so as to be moved independently of first and second recognition means 3 and 4, as needed. Further, the means may be attached to the movable table to which first and second recognition means 3 and 4 are attached.

Industrial Applications of the Invention

The chip mounting device and calibration method therein according to the present invention can be applied to any type of chip mounting devices requiring an alignment of objects to be bonded to each other, such as a device for simply mounting a chip or a device for bonding a chip. By the application of the present invention, a high accuracy for calibration can be maintained, and the productivity can be improved by reducing the number of times of the calibration.

What is claimed is:

1. A chip mounting device comprising:

a first recognition mark on a chip-retainable head side and a second recognition mark on a substrate-retainable stage side, said first and second recognition marks being vertically apart from each other;

a first recognition means for recognizing said first recognition mark and a second recognition means for recognizing said second recognition mark;

a third recognition means for recognizing said first and second recognition marks concurrently when said first recognition mark is brought close to or into contact with said second recognition mark; and a temperature detection means for detecting a beyond-allowance temperature change to output a signal for initiating a calibration based on the concurrent recognition of said recognition marks.

2. The chip mounting device according to claim 1, wherein said first recognition mark is provided on said head and said second recognition mark is provided on said stage.

3. The chip mounting device according to claim 2, wherein a suction hole provided on said head for retaining a chip is formed as said first recognition mark.

4. The chip mounting device according to claim 1, wherein said first recognition mark is provided on said head and said second recognition mark is provided on a substrate retained by said stage.

5. The chip mounting device according to claim 4, wherein a suction hole provided on said head for retaining a chip formed as said first recognition mark.

6. The chip mounting device according to claim 1, wherein said first recognition mark is provided on a chip retained by said head and said second recognition mark is provided on said stage.

7. The chip mounting device according to claim 1, wherein said first recognition mark is provided on a chip retained by said head and said second recognition mark is provided on a substrate retained by said stage.

8. The chip mounting device according to claim 1, wherein said first recognition means and said second recognition means are provided so as to be moved integrally.

9. The chip mounting device according to claim 1, wherein said temperature detection means is attached to said first recognition means or said second recognition means.

10. The chip mounting device according to claim 1, wherein said head is provided movably only in a vertical direction.

11. The chip mounting device according to claim 1, wherein said head has a heater.

12. The chip mounting device according to claim 1, wherein said stage is provided movably.

13. The chip mounting device according to claim 1, wherein said stage is provided movably at a condition of parallel translation and/or rotatably.

14. A calibration method in a chip mounting device comprising the steps of:

recognizing a first recognition mark on a chip-retainable head side and a second recognition mark on a substrate-retainable stage side, said first and second recognition marks being vertically apart from each other;

bringing said first recognition mark close to or into contact with said second recognition mark;

concurrently recognizing said first and second recognition marks which have been brought close to or into contact with each other; and detecting a beyond-allowance temperature change to output a signal for initiating a calibration based on the concurrent recognition of said recognition marks.

15. A calibration method in a chip mounting device comprising the steps of:

concurrently recognizing a first recognition mark on a chip-retainable head side and a second recognition mark on a substrate-retainable stage side, said first and second recognition marks being vertically apart from each other; and detecting a beyond-allowance temperature change to output a signal for initiating a calibration based on the concurrent recognition of said recognition marks.

* * * * *

UNITED STATES PATENT AND TRADEMARK OFFICE
CERTIFICATE OF CORRECTION

PATENT NO. : 6,811,627 B2
DATED : November 2, 2004
INVENTOR(S) : Yoshiyuki Arai et al.

It is certified that error appears in the above-identified patent and that said Letters Patent is hereby corrected as shown below:

<u>Tilte page,</u>
Item [54], Title, "CALLIBRATION" should read -- CALIBRATION --

Signed and Sealed this

Seventeenth Day of May, 2005

JON W. DUDAS
*Director of the United States Patent and Trademark Office*